US005241556A

United States Patent [19]
Macomber et al.

[11] Patent Number: 5,241,556
[45] Date of Patent: Aug. 31, 1993

[54] CHIRPED GRATING SURFACE EMITTING DISTRIBUTED FEEDBACK SEMICONDUCTOR LASER

[75] Inventors: Steven H. Macomber, Bethel, Conn.; Jeffrey S. Mott, Shenorock, N.Y.

[73] Assignee: Hughes Aircraft Company, Los Angeles, Calif.

[21] Appl. No.: 826,720

[22] Filed: Jan. 28, 1992

[51] Int. Cl.⁵ .................... H01S 3/19; H01S 3/08
[52] U.S. Cl. ........................ 372/96; 372/46; 372/92
[58] Field of Search ............. 372/96, 92, 45, 46

[56] References Cited

U.S. PATENT DOCUMENTS 4,847,844 7/1989 Noda et al. ..................... 372/96

Primary Examiner—James W. Davie
Attorney, Agent, or Firm—Michael W. Sales; Wanda K. Denson-Low

[57] ABSTRACT

A chirped grating surface emitting distributed feedback semiconductor laser device (10) includes a P-side ohmic contact (28) and an N-side ohmic contact (36). A potential difference is applied across these contacts to create an electric field that induces a stimulated emission of coherent photon radiation. The coherent photon radiation produced by the stimulated emission process is incident upon a linearly varying, second order chirped grating surface (29). An output beam, directed normal to a chemically etched output window (38), is produced by a first order diffraction of photon radiation from the chirped grating surface (29). The output beam has a non-uniform longitudinal mode near-field output intensity profile and a non-abrupt longitudinal mode near-field phase, both due to a reduced destructive interference interaction in a second order diffraction of photon radiation along the grating surface (29). The output beam also has a desired single lobed longitudinal mode far-field output intensity profile. Moreover, the device achieves a 20% power efficiency due to the reduced destructive interference in the second order diffraction.

14 Claims, 4 Drawing Sheets

CHIRPED GRATING SURFACE EMITTING DISTRIBUTED FEEDBACK SEMICONDUCTOR LASER

BACKGROUND OF THE INVENTION

1. Field of the Invention

The present invention relates to semiconductor lasers and, more particularly, to a surface emitting distributed feedback semiconductor laser with a chirped grating surface that provides high power efficiency and produces a nearly single-lobed longitudinal mode far-field beam profile.

2. Description of the Prior Art

Light amplification by the stimulated emission of radiation (laser) produces unidirectional, monochromatic, and most importantly coherent visible light. The stimulated emission of radiation is a process in which the energy state of an atom can change in a quantum transition with the emission of a photon. During this process, a photon approaches an atom, initially in an excited energy state, and induces this atom to make a transition to a lower energy state. As the atom's energy state is lowered, the atom emits a photon. This emitted photon, which is separate from the photon that induced the energy transition, possesses an energy that is equal to the difference between the excited and the lower energy states of the atom. Moreover, this emitted photon and the inducing photon both leave the atom in the same direction the inducing photon had as it approached the atom. These photons are also exactly in relative phase with one another; that is, they are coherent. This coherence is dictated by energy conservation in that if the two photons were out of phase by any amount they would interfere destructively, thereby violating energy conservation. Therefore, stimulated emission of radiation is a process that induces coherent photon multiplication or light amplification, thus a laser.

Laser technology has evolved by applying the above stated principle to several different types of active media. The most recent development in this field, coupled with the advancements in semiconductor fabrication technology, is the semiconductor laser. Unlike an atomic laser, however, stimulated emission in a semiconductor laser occurs when there is an excited state of a solid state material, thus it involves more than one atom.

A surface emitting distributed feedback semiconductor laser is a device that produces unidirectional, monochromatic, coherent visible light through stimulated emission in semiconductor materials. This device has a positively doped side and a negatively doped side that are joined at a junction, and a grating surface that is fabricated onto an outer surface of the positively doped side. The grating surface, fabricated with a strong conductive material, provides a means by which coherent photon energy fields may be diffracted. A second order grating design permits deflections of coherent photon radiation to be directed normal to an output window etched into the negatively doped side of the junction through first order diffraction, and directed parallel to the grating surface through second order diffraction. The first order diffraction produces a beam of unidirectional, monochromatic, coherent visible light at the output window, whereas the second order diffraction provides a feedback of photon radiation to an active region that is adjacent and parallel to the uniform grating surface.

A theoretical longitudinal mode near-field intensity profile produced at the output window of a surface emitting distributed feedback semiconductor laser device is antisymmetric with a zero intensity null at the output window center. A corresponding theoretical longitudinal mode far-field intensity profile is double-lobed and symmetric about the output window center. These theoretical intensity profiles have been practically demonstrated in actual device measurements, although in these measurements it is found that spontaneous emission partially fills the near-field center null. Much has been written on the subject of semiconductor lasers in recent years and some good descriptive background articles on these devices are *Surface Emitting Distributed Feedback Semiconductor Laser*, Applied Physics Letters, Volume 51, Number 7, pp. 472–474, August 1987, and *Analysis of Grating Surface Emitting Lasers*, IEEE Journal of Quantum Electronics, Volume 26, Number 3, pp. 456–466, March 1990.

SUMMARY OF THE INVENTION

The present invention contemplates a surface emitting distributed feedback semiconductor laser that uses a non-uniform, linearly varying chirp in a second order grating to provide high power efficiency while producing a nearly single-lobed, longitudinal mode far-field output intensity profile. This second order chirped grating is holographically patterned, by a process described in the related and copending patent application Ser. No. 07/822,253, entitled, Apparatus and Method for Fabricating a Chirped Grating in a Surface Emitting Distributed Feedback Semiconductor Laser Device, filed on the same date as the present application and assigned to the assignee hereof, and chemically etched onto a surface of a thin, positively doped cladding layer of an aluminum, gallium, and arsenic material compound (AlGaAs) that is grown on a negatively doped AlGaAs cladding layer. This negatively doped AlGaAs cladding is grown on a negatively doped gallium and arsenic material compound (GaAs) substrate. The surface of the chirped grating is coated with gold (Au) metal to attain high diffraction efficiency, and to reduce radiation losses in any photon energy fields that are incident upon this surface.

In stimulated emission, an incoming photon stimulates an excited state atom and an additional photon is created. Both the incoming photon and the newly created photon leave the atom in the same direction as that of the incoming photon, and they are exactly in phase with each other, or coherent.

In the present invention, stimulated emission occurs in an electrically pumped section of an active region between the positively and negatively doped AlGaAs claddings. A portion of the photon energy exiting this stimulated emission region is incident upon the gold coated chirped grating surface. This photon radiation is deflected normal to the negatively doped AlGaAs cladding through first order diffraction and deflected along the surface of the gold coated grating through second order diffraction. The first order diffraction produces an output beam of photon radiation that is directed through a window etched into the negatively doped GaAs substrate. The second order diffraction produces a feedback of photon radiation to the stimulated emission region by way of two oppositely directed photon fields. These oppositely directed photon fields propagate along directions perpendicular to the grating grooves and parallel to the grating surface. Since there is only a thin, positively doped AlGaAs cladding layer between the grating surface and the active region, these second order diffracted photon fields are fed back into the stimulated emission region, thereby amplifying the stimulated emission process. The magnitude of an amplitude function for these oppositely directed, second order diffracted photon fields is directly dependent upon the structure of the grating surface.

A uniform, unchirped grating surface will produce two oppositely directed, second order diffracted photon fields whose amplitude functions are antisymmetric to one another about the center of the grating surface. The superposition of these oppositely directed photon fields leads to an abrupt 180 degree phase shift in the near-field phase at the center of the output window. This phase shift is caused by a total destructive interference interaction between the antisymmetric, oppositely directed photon fields at the center of the grating surface. The longitudinal mode output beam intensity profiles produced by a surface emitting distributed feedback semiconductor laser with this type of interference interaction in second order diffracted photon radiation have an antisymmetric near-field with a zero intensity null at the center of the output window, and a corresponding symmetric, double-lobed far-field.

A grating surface with a linearly varying chirp will produce two oppositely directed, second order diffracted photon fields whose amplitude functions are non-uniform, although they do interfere with one another. The superposition of these oppositely directed photon fields leads to a tilting of the near-field phase that effectively eliminates the abrupt 180 degree phase shift that is seen with the unchirped grating surface. This phase tilting is caused by a reduced interference interaction between the non-uniform, oppositely directed photon fields along the grating surface. The longitudinal mode near-field output intensity profile produced from this type of interference interaction in the second order diffracted photon radiation is non-uniform and non-antisymmetric and there is no longer a null region at the center of the output window. The elimination of the abrupt 180 degree near-field phase shift produces a corresponding longitudinal mode far-field that has the desired single-lobe output intensity profile. Also, due to the reduced interference interaction between the non-uniform, oppositely directed photon fields, the device power efficiency is increased.

A primary objective of the present invention is to provide a surface emitting distributed feedback semiconductor laser with a chirped grating.

Another objective of the present invention is to provide a surface emitting distributed feedback semiconductor laser that produces a single-lobed longitudinal mode far-field output intensity profile.

Another objective of the present invention is to provide a surface emitting distributed feedback semiconductor laser with high power efficiency.

DETAILED DESCRIPTION OF THE PRESENT INVENTION

Figure 1:
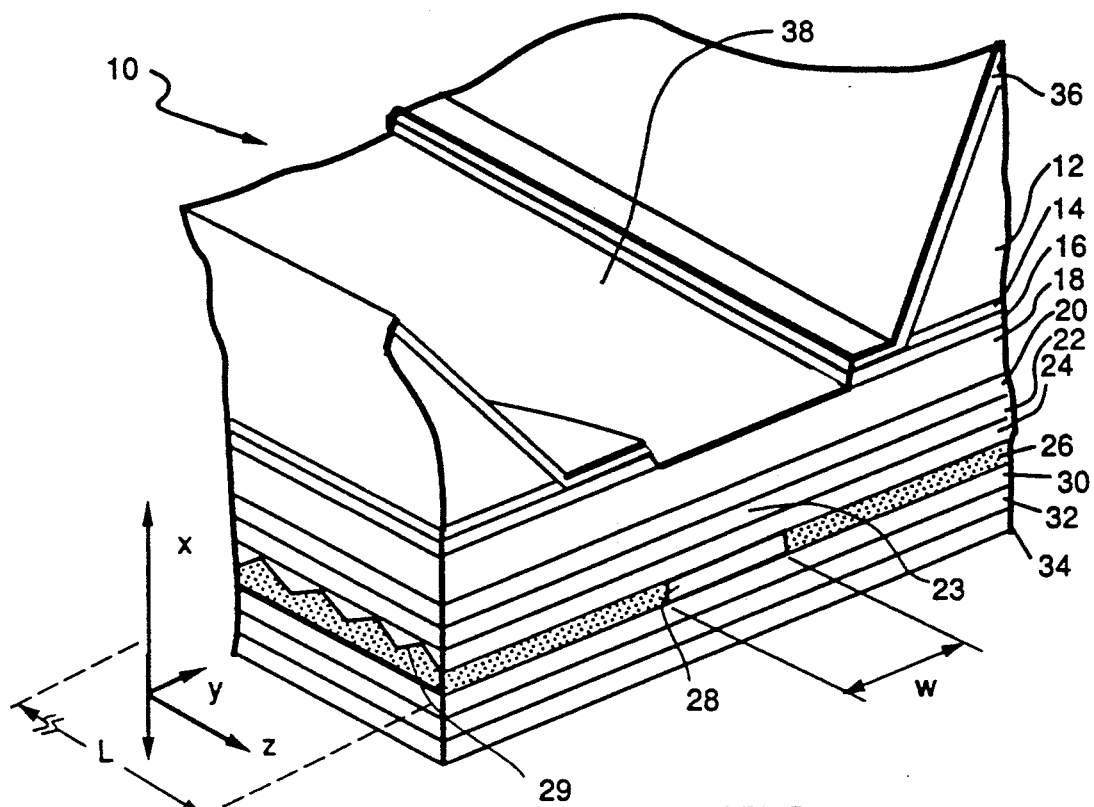
FIG. 1 is a cross-sectional view of a chirped grating surface emitting distributed feedback semiconductor laser device structure according to the present invention.

Referring to FIG. 1, there is shown a cross-sectional view of a surface emitting distributed feedback semiconductor laser structure 10 with a chirped grating surface 29. This laser diode device 10 is fabricated on a negatively (N) doped GaAs substrate 12. Many epitaxial layers are grown on this substrate 12, including a stop-etch layer 14, an N-doped GaAs layer 16, an N-doped AlGaAs cladding layer 18, an N-doped AlGaAs confinement layer 20, an AlGaAs active layer 22, and a thin, positively (P) doped AlGaAs cladding layer 24. The P-doped AlGaAs epitaxial cladding layer 24 is coated with photoresist, holographically exposed, and chemically etched to create a second order chirped grating 29. A dielectric mask of silicon dioxide ($SiO_2$) 26 is then deposited over P-doped AlGaAs grating surface 29 for isolation and current confinement.

The N-doped GaAs substrate 12 is coated with photoresist and optically patterned and etched to produce a well, exposing the N-doped GaAs epitaxial layer 16. A gold, germanium, and nickel material compound (AuGeNi) layer 36 is deposited on the N-side of the laser diode structure. Another photoresist mask is applied and pattern exposed to the N-side contact 36 and an output window 38 is formed by chemical etching. The gold, germanium, and nickel material compound (AuGeNi) layer is then annealed to serve as an ohmic contact. The output window allows photon radiation diffracted normal from the surface of the second order, gold coated chirped grating 29 to exit laser diode device 10.

A stripe 28 of length, L, along the Z-axis coordinate and width, W, along the Y-axis coordinate is etched into the $SiO_2$ layer 26 down to the grating surface 29. Gold (Au) metal is evaporated into this striped region 28. This gold stripe region 28 serves as an ohmic contact for the P-side of the laser diode structure 10. Barrier metal layers of chromium (Cr) 30, platinum (Pt) 32, and gold 34 are deposited over the gold stripe 28 and $SiO_2$ 26 regions to provide low thermal resistance in the negative X-axis direction.

When a positive potential difference is applied from the P-side ohmic contact 28 to the N-side ohmic contact 36 of the laser diode structure 10, an electric field is produced in the positive X-axis coordinate direction. This electric field provides two conditions that are essential for the semiconductor lasing process.

First, as the potential difference, and the corresponding electric field, between the P-side 28 and the N-side 36 ohmic contacts is increased, a recombination of electrons from the N-side with holes from the P-side is increased. During a single recombination process the electric field drives a mobile electron from the N-side 20 and a mobile hole from the P-side 30 into the active layer 22, where the mobile electron is annihilated by the mobile hole. In this process, a solid state material, that is initially in an excited energy state with a mobile hole in its valence band, transitions to a lower energy state as a mobile electron fills this mobile hole. This energy transition results in the emission of a photon at an energy equal to the difference between the excited and lower energy states. This process is called spontaneous emission.

Secondly, stimulated emission is a process in which an incoming photon stimulates an excited energy state solid state material to make a transition to a lower energy state, and an additional photon is created. This newly created photon and the incoming photon both leave the atom in a coherent manner. Stimulated absorption is a process in which an incoming photon stimulates, or induces, a low energy state of an molecule, or a solid state material atom, to make a transition to a higher energy state, and the photon is absorbed. For light amplification, or lasing, to occur the stimulated emission process must dominate the stimulated absorption process. In the case of the semiconductor laser described here, this situation occurs when energy from the positive X-axis coordinate directed electric field electrically pumps a region 23 in the AlGaAs active layer 22, of the same length, L, and width, W, as the gold stripe region 28. This electrical pumping induces excited electrons and holes in the AlGaAs material, initially in a low energy state, to transition to an upper energy state, thereby creating a high density of electron and holes, or a population inversion, in the electrically pumped region of the active layer 22. This population inversion provides a greater probability that an incoming photon will induce a stimulated emission rather than a stimulated absorption, and thus stimulated emission is the dominant process.

In the present invention, spontaneous emission provides photons to the electrically pumped region 23 of the AlGaAs active layer 22. These spontaneously emitted photons initiate a stimulated emission process in this region due to a population inversion. Once initiated, the laser oscillates in a self-perpetuating manner and at a frequency that is determined by the feedback mechanism, which in this type of laser is the grating. A portion of the coherent photon radiation produced from the stimulated emission process is incident upon the grating surface 29 in the gold stripe region 28. This incident photon radiation is partially deflected in the positive X-axis coordinate direction through first order diffraction and partially deflected in both the positive and negative Z-axis coordinate direction through second order diffraction. The first order diffraction produces a coherent beam of photon radiation directed through the output window 38. The second order diffraction produces a coherent feedback of photon radiation to the electrically pumped active region 23 by way of a positive Z-axis coordinate directed photon field and a negative Z-axis coordinate directed photon field. The amplitude of the positive Z-axis coordinate directed photon field is represented by the function $R(z)$, while the amplitude of the negative Z-axis coordinate directed photon field is represented by the function $S(z)$.

Figure 2:
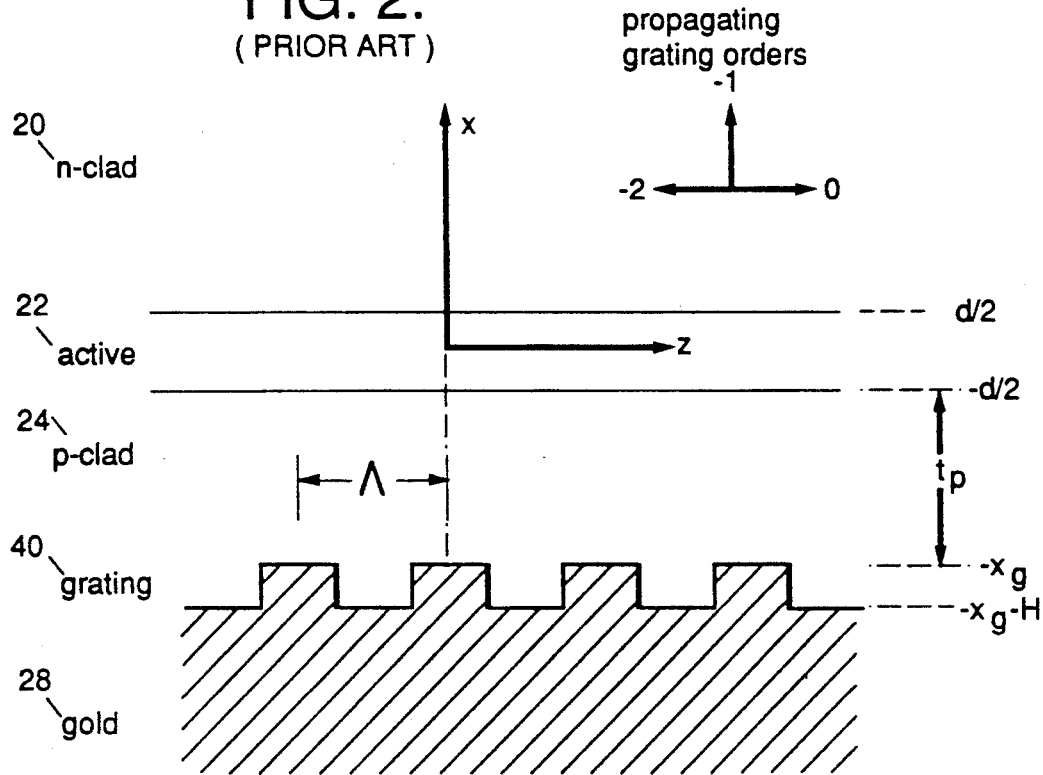
FIG. 2 is a cross-sectional plan view of a prior art unchirped grating surface.

Referring FIG. 2, there is shown a second order, unchirped grating 40 of constant periodicity, $\Lambda$, grating layer thickness, H, P-doped cladding layer thickness, $t_p$, and active layer thickness, d. It has been described in *AlGaAs Surface-Emitting Distributed Feedback Laser*, Proceedings of the SPIE, 1988, that the optimal grating periodicity for a surface emitting distributed feedback semiconductor laser with a AlGaAs active material is on the order of 0.24 $\mu$m. It has also been described in the *Analysis of Grating Surface Emitting Lasers* article that, for this same material and grating periodicity, an optimal surface diffraction occurs when the grating layer has a thickness, $H=0.1$ $\mu$m, for a $d=0.1$ $\mu$m and a $t_p=0.30$ $\mu$m.

Figure 3:
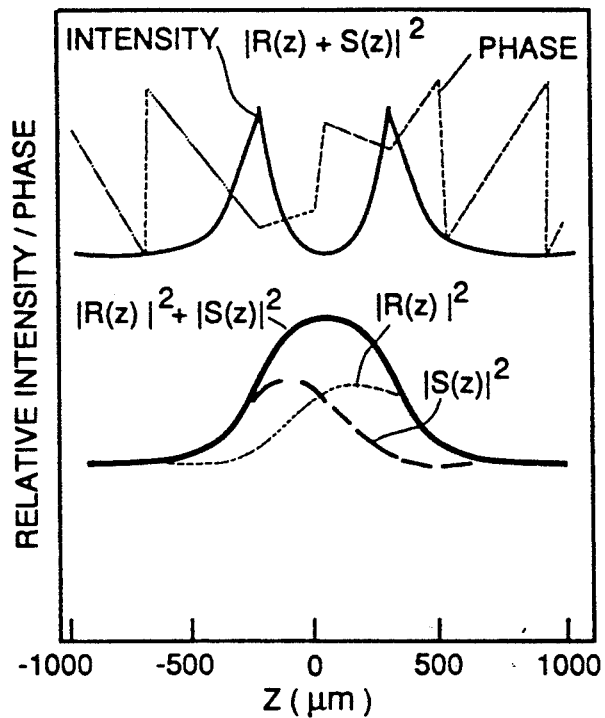
FIG. 3 shows the theoretical longitudinal mode near-field output intensity and phase profile for a surface emitting distributed feedback semiconductor laser device with a prior art unchirped grating and a stripe length of 500 $\mu$m.
Figure 4:
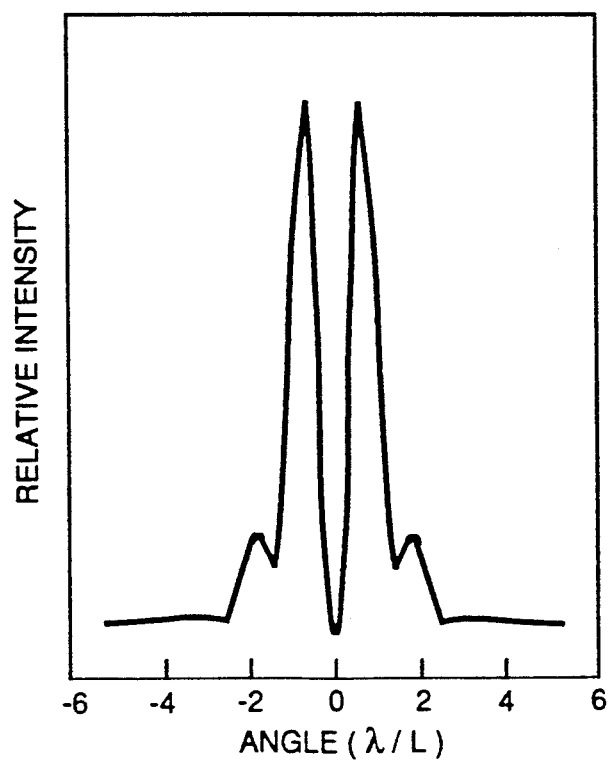
FIG. 4 shows the theoretical longitudinal mode far-field output intensity profile for a surface emitting distributed feedback semiconductor laser device with a prior art unchirped grating and a stripe length of 500 $\mu$m.

Referring FIG. 3, there is shown the near-field intensity and phase profiles for an unchirped grating surface emitting distributed feedback semiconductor laser with the above stated dimensional characteristics and a stripe length, L, of 500 $\mu$m. For this device, the amplitude functions $R(z)$ and $S(z)$ of the oppositely directed, second order diffracted photon fields are antisymmetric to one another about the center of the gold stripe grating surface 40. The superposition of these antisymmetric, oppositely directed photon fields leads to an abrupt 180 degree phase shift in the near-field phase at the center of the output window 38. This phase shift is caused by a total destructive interference interaction between the antisymmetric, oppositely directed photon fields at the center of the grating surface. The longitudinal mode near-field output intensity profile is shown to be antisymmetric with a zero intensity null at the output window 38 center. The corresponding longitudinal mode far-field output intensity profile for this same device is symmetric and double-lobed, as shown in FIG. 4.

The introduction of a linearly varying chirp to the grating periodicity has a dramatic effect on the device output intensity profiles and power efficiency. This chirp can be quantified by expressing the periodicity, $\Lambda$, as a function of the Z-axis coordinate. In particular, the optimum chirp for a surface emitting distributed feedback semiconductor laser with the same dimensional characteristics as described for the above unchirped grating device is approximately, $$\frac{d\Lambda(z)}{dz} = \frac{C}{2}\left(\frac{\Lambda}{L}\right)^2,$$

where $\Lambda$ is the grating periodicity that was determined to be optimum for the unchirped grating (0.24 $\mu$m), L is the stripe length ranging from 300 $\mu$m to 2000 $\mu$m, and C is a constant that represents the degree of the chirp.

Figure 5:
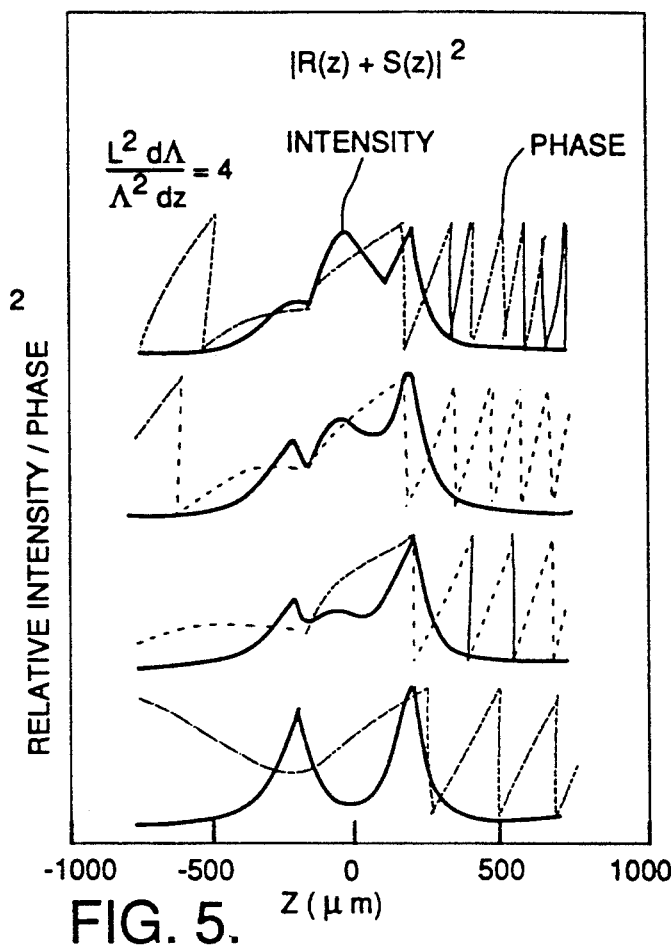
FIG. 5 shows the theoretical longitudinal mode near-field output intensity and phase profiles for chirped grating surface emitting distributed feedback semiconductor laser devices of linearly varying chirp and stripe length of 500 $\mu$m.

Referring the FIG. 5, there is shown the calculated near-field intensity and phase profiles of four devices each having a separate degree of linearly varying chirp. For these devices, the amplitude functions $R(z)$ and $S(z)$ of the oppositely directed, second order diffracted photon fields are non-uniform, although they do interfere with one another. The superposition of these non-uniform, oppositely directed photon fields leads to a tilting of the near-field phase that effectively eliminates the abrupt 180 degree phase shift that is seen with the unchirped grating surface. This phase tilting is caused by a reduced interference interaction between the non-uniform, oppositely directed photon fields along the grating surface. As the degree of chirp is increased, the longitudinal mode near-field output intensity profile is shown to fill in the zero intensity center null that is seen in devices with unchirped gratings.

Figure 6:
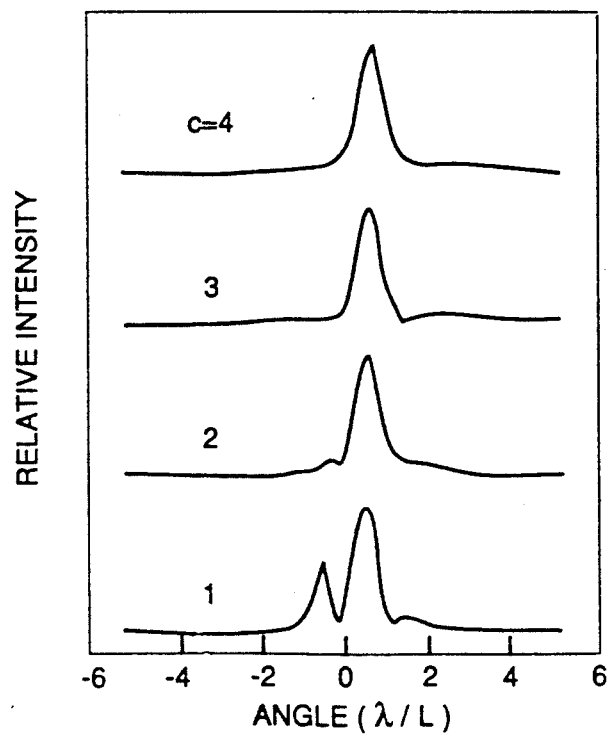
FIG. 6 shows the theoretical longitudinal mode far-field output intensity profiles for chirped grating surface emitting distributed feedback semiconductor laser devices of linearly varying chirp and stripe length of 500 $\mu$m.

Referring FIG. 6, there is shown the corresponding calculated longitudinal mode far-field output intensity profiles for the same degrees of varying chirp as shown in FIG. 5. The elimination of the 180 degree phase shift in the near-field phase produces an output beam with the desired single far-field lobe. Also, the filling in of the near-field intensity at the center of the output window 38 has the effect of reducing the far-field side lobes. Furthermore, due to the reduced interference interaction between the non-uniform, oppositely directed photon fields, a device power efficiency of approximately 20% is achieved. This power efficiency is more than a factor of two improvement over surface emitting distributed feedback semiconductor lasers with unchirped grating surfaces.

Figure 7:
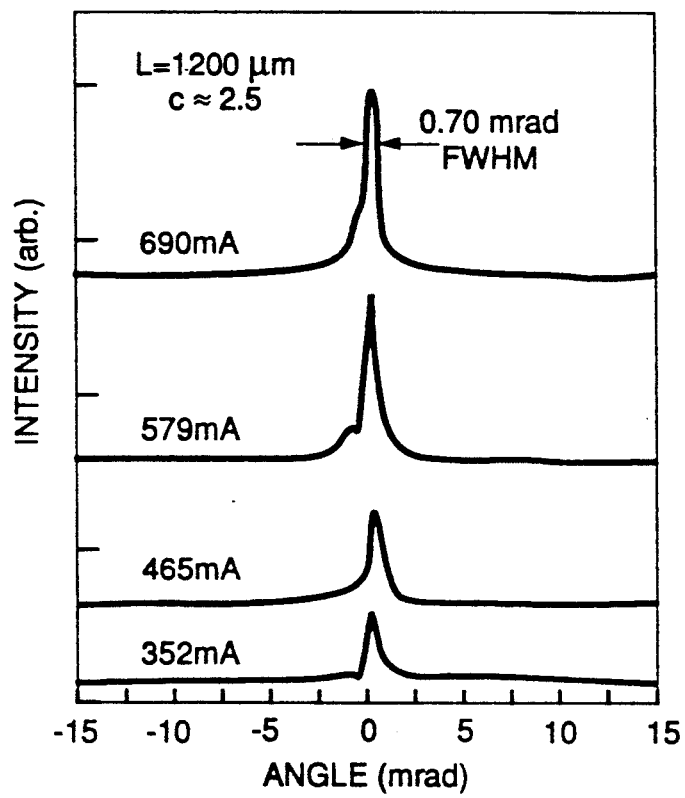
FIG. 7 shows the actual longitudinal mode far-field output intensity profiles of a chirped grating surface emitting distributed feedback semiconductor laser device with a stripe length of 1200 $\mu$m under various continuous wave current operating conditions.

Referring to FIG. 7, there is shown the actual longitudinal mode far-field output intensity profiles of a chirped grating surface emitting distributed feedback semiconductor laser device with a stripe length of 1200 μm and linearly varying a chirp of approximately 2.5. These profiles were measured at various continuous wave currents, and a 0.70 mrad full wave at half maximum (FWHM) far-field angle was measured at 690 mA.

It is thus seen that the objectives set forth above are efficiently attained and, since certain changes may be made in the above device without departing from the scope of the invention, it is intended that all matter contained in the above description or shown in the accompanying drawings shall be interpreted as illustrative and not in a limiting sense.

What is claimed is:

1. In a surface emitting distributed semiconductor laser device having a structure of dielectric, metal, and semiconductor material layers, including a positively doped semiconductor cladding layer having a grating etched onto its surface, said grating having a plurality of grating grooves, the improvement comprising: a chirp in said grating for reducing a destructive interference in a pair of opposing, second order diffracted photon fields, wherein said grating is a second order having a linearly varying chirp each of said second order grating grooves being substantially parallel to each other and each of said grating groove walls also being substantially parallel with each other and wherein said second order linearly varying chirp is optimally expressed by an equation, $$\frac{d\Lambda(z)}{dz} = \frac{C}{2}\left(\frac{\Lambda}{L}\right)^2,$$

wherein $\Lambda$ is a nominal grating periodicity, L is a length of an ohmic contact at a surface of said grating, C is a constant that represents a degree of said chirp, and Z is said coordinate line normal to said grating groove walls, whereby a longitudinal mode far-field output intensity profile of said laser device is single lobed and said laser device has a high power efficiency.

2. A surface emitting distributed feedback semiconductor laser device as described in claim 1, wherein each grating groove has two walls and a floor.

3. A surface emitting distributed feedback semiconductor laser device as described in claim 1, wherein said nominal grating periodically, $\Lambda$, has a value of 0.24 μm.

4. A surface emitting distributed feedback semiconductor laser device as described in claim 1, wherein said ohmic contact length, L, has a range of values from 300 μm to 2000 μm.

5. A surface emitting distributed feedback semiconductor laser device as described in claim 1, wherein said power efficiency is approximately to 20%.

6. A surface emitting distributed feedback semiconductor laser device comprising:
a negatively doped semiconductor material substrate;
a plurality of semiconductor material epitaxial layers;
a grating etched into one of said semiconductor material epitaxial layers, said grating is of a second order having a linearly varying chirp, said grating having a plurality of grating grooves that are substantially parallel to each other and each of said plurality of grating grooves has two walls that are also substantially parallel to each other wherein said second order linearly varying chirp is optimally expressed by an equation, $$\frac{d\Lambda(z)}{dz} = \frac{C}{2}\left(\frac{\Lambda}{L}\right)^2,$$

wherein $\Lambda$ is a nominal grating periodicity, L is a length of an ohmic contact at a surface of said grating, C is a constant that represents a degree of said chirp, and Z is said coordinate line normal to said grating groove walls;
a dielectric material layer;
a duality of ohmic contacts;
a plurality of barrier metal layers; and
an output window etched into said semiconductor material substrate.

7. A surface emitting distributed feedback semiconductor laser device as described in claim 6, wherein said negatively doped semiconductor substrate is of a gallium and arsenic material compound (GaAs).

8. A surface emitting distributed feedback semiconductor laser device as described in claim 6 wherein said semiconductor epitaxial layers comprise:
a stop etch layer;
a negatively doped GaAs layer;
a negatively doped aluminum, gallium and arsenic material compound (AlGaAs) cladding layer;
a negatively doped AlGaAs confinement layer;
a AlGaAs active layer; and
a positively doped AlGaAs cladding layer.

9. A surface emitting distributed feedback semiconductor laser device as described in claim 8, wherein said AlGaAs active layer is positively doped.

10. A surface emitting distributed feedback semiconductor laser device as described in claim 8, wherein said AlGaAs active layer is negatively doped.

11. A surface emitting distributed feedback semiconductor laser device as described in claim 6, wherein said nominal grating periodicity, $\Lambda$, has a value of 0.24 μm.

12. A surface emitting distributed feedback semiconductor laser device as described in claim 6, wherein said ohmic contact length, L, has a range of values from 300 μm to 2000 μm.

13. A surface emitting distributed feedback semiconductor laser device as described in claim 6, wherein said duality of ohmic contacts comprise:

a gold (Au) metal material evaporated directly onto said grating to form a P-side ohmic contact; and a gold, germanium, and nickel material compound (AuGeNi) deposited directly onto said substrate to form an N-side ohmic contact.

14. A surface emitting distributed feedback semiconductor laser device as described in claim 6, wherein said barrier metal layers comprise:

a chromium (Cr) metal layer;
a platinum (Pt) metal layer; and
a gold (Au) metal layer.

* * * * *